(12) United States Patent
Wang et al.

(10) Patent No.: US 6,653,763 B2
(45) Date of Patent: Nov. 25, 2003

(54) DUAL STAGE ACTUATOR SYSTEMS FOR HIGH DENSITY HARD DISK DRIVES USING ANNULAR ROTARY PIEZOELECTRIC ACTUATORS

(75) Inventors: Zhihong Wang, Singapore (SG); Tamon Kasajima, Dongguan (CN); Masashi Shiraishi, Dongguang (CN); Ping Shang, Dongguang (CN); Kai Wu, Dongguang (CN)

(73) Assignee: SAE Magnetics (H.K.) Ltd., Kwai Chung (HK)

( * ) Notice: Subject to any disclaimer, the term of this patent is extended or adjusted under 35 U.S.C. 154(b) by 256 days.

(21) Appl. No.: 09/811,112

(22) Filed: Mar. 16, 2001

(65) Prior Publication Data

US 2001/0055182 A1 Dec. 27, 2001

(30) Foreign Application Priority Data

Jun. 8, 2000 (CN) .................. PCT/CN00/00148

(51) Int. Cl.[7] .............................................. H01L 41/08
(52) U.S. Cl. .................... 310/369; 310/367; 360/294.4; 360/294.6
(58) Field of Search ................ 310/26, 367, 369, 310/368, 370; 360/292, 294.4, 294.6, 66, 294.3, 294.1, 294, 291.9, 290, 240

(56) References Cited

U.S. PATENT DOCUMENTS

| | | | | |
|---|---|---|---|---|
| 2,812,452 A | * | 11/1957 | Harris | 310/322 |
| 2,928,069 A | * | 3/1960 | Petermann | 367/157 |
| 3,168,623 A | * | 2/1965 | Petermann | 369/144 |
| 3,781,955 A | * | 1/1974 | Lavrinenko et al. | 29/25.35 |
| 5,596,243 A | * | 1/1997 | Tsuru et al. | 310/348 |
| 2002/0039261 A1 | * | 4/2002 | Sividasan et al. | 360/294.4 |

FOREIGN PATENT DOCUMENTS

| JP | 61-202508 | * | 9/1986 | ................ 310/368 |
|---|---|---|---|---|

* cited by examiner

Primary Examiner—Thomas M. Dougherty
(74) Attorney, Agent, or Firm—Kenyon & Kenyon (57) ABSTRACT

A piezoelectric actuator is disclosed including an annular piezoelectric element and a base. There is a gap along the radial direction of the annular piezoelectric element. One of the two ends, i.e., the fixed end of the said annular element, is connected to the base, while the other end is free. The base is made of piezoelectric materials. Furthermore, the annular element is divided into two or more annular parts along the direction of its circumference by the electrode patterns applied on its two opposite surface and/or its polarization directions. When driving voltages are applied, the actuator can generate roughly a rotary motion around the center of the annular piezoelectric element. The annular rotary actuator could be either a single plate or with multilayer structure. The present invention further relates to a dual stage head positioning actuator system of a hard disk drive with a plurality of disks and a plurality of vertically aligned head sliders mounted on distal ends of a plurality of suspensions via the annular piezoelectric actuators.

19 Claims, 10 Drawing Sheets

DUAL STAGE ACTUATOR SYSTEMS FOR HIGH DENSITY HARD DISK DRIVES USING ANNULAR ROTARY PIEZOELECTRIC ACTUATORS

FIELD OF THE INVENTION

The present invention generally relates to the field of piezoelectric devices and more particularly, but not by way of limitation, to an annular rotary piezoelectric actuator suitable for use as a secondary fine actuator in a dual stage head positioning servo system of a hard disk drive and to a dual stage actuator system for a high density hard disk drive using the annular rotary piezoelectric actuator.

DESCRIPTION OF THE RELATED ART

Piezoelectric actuators have been used as positioners or driving motors in a broad spectrum of fields such as optics, precision machining, fluid control and optical disk drives due to their characteristics of small size, simple structure, quick response and, most importantly, controllable displacement down to nanometers.

In the area of hard disk drives, however, there exists a competition between micro machining electrostatic, electromaganic micro actuators and piezoelectric actuators. The micro machining actuators are designed to drive the slider directly. An advantage of this type of actuator is its higher resonance frequency, but its stroke/voltage sensitivity is very small. The piezoelectric actuators, on the other hand, are commonly used to control the motion of the suspension. Compared with the former, the latter has a larger stroke/voltage sensitivity and a relatively lower resonance frequency. Unfortunately, the resonance frequency and stroke are of the same importance to the dual stage head positioning servo system of the hard disk drive. A piezoelectric actuator is disclosed in U.S. patent application Ser. No. 08/874,814 (U.S. Pat. No. 5,898,544) filed on Jun. 13, 1997 by Todd A. Krinke et al. entitled Base Plate-mounted Microactuator for a Suspension which is assigned to Hutchinson Technology Incorporated.

Regarding the piezoelectric actuator, for the purpose of decreasing the driving voltage, $d_{31}$ type multilayer, split-morph multilayer and II-beam multilayer are presented as the secondary fine actuators of the dual stage servo system. However, the conflict of resonance frequency and stroke still remains unresolved.

In the present invention a micro machining piezoelectric actuator used to drive the slider directly is proposed to meet the requirements of resonance frequency and stroke simultaneously.

SUMMARY OF THE INVENTION

A general object of the present invention is to provide a new structure of piezoelectric actuator which has a function of generating rotary deformation around its shape center.

A specific object of the present invention is to provide a piezoelectric actuator which can be used as a secondary actuator in a dual stage servo system of a hard disk drive.

A more specific object of the present invention is to provide a piezoelectric actuator which can be mounted between the suspension and the slider to drive the magnetic pole tip of the slider to move across data tracks so as to obtain a head positioning servo system with high bandwidth.

Yet another specific object of the present invention is to provide a piezoelectric actuator which has a symmetric configuration and a simple potting process so that it can be easily manufactured and realized in a head gimble assembly (HGA).

Another object of the present invention is to provide a piezoelectric actuator which has enough displacement stroke to meet the requirement of compensating tracking misregistration under a supply voltage up to 15 volts.

The above objects can be achieved according to embodiments of the present invention by designing the configuration, selecting appropriate electrode patterns and corresponding poling scheme of a piezoelectric element. Hereinafter the typical practice means will be described.

In accordance with one aspect of the present invention, an annular piezoelectric element with a gap along the radial direction is divided into two parts by an electrode crevice along its circumference at a certain radius. Polarization vectors in these parts are generally in the direction of its thickness and can be polarized either in the same or opposite direction. One of the two ends of the element is affixed to a base. Driving voltages are so arranged that they make one of the two parts expanded by the '31' action while the other contracted, or one of the two parts expanded or contracted while the other remains constant. This will result in roughly a rotary motion of the free end around its center, rather like the bending of a split-morph actuator, where the bending is in the direction of its width. This actuator is actually an annular split electrode rotary piezoelectric actuator. Analogous to the name of "split-morph", it can be defined as "annular split-morph". If only one of the two parts is polarized, this actuator can be called partial poling annular split-morph. If the poling vectors in the two corresponding parts of the element are opposite to each other, this actuator is called antiparallel annular split-morph, and if the poling vectors are the same, it is called parallel annular split-morph.

In accordance with another aspect of the present invention, a dual stage head positioning actuator system is provided for a hard disk drive having a plurality of disks and a plurality of vertically aligned head sliders mounted on distal ends of a plurality of suspensions via micro piezoelectric actuators. In one embodiment, the dual stage head positioning actuator system includes a voice coil motor as the primary stage actuator to simultaneously drive the plurality of suspensions in a long stroke; and a plurality of piezoelectric actuators as the secondary fine actuator to drive the head slider individually in a fine stroke for precisely positioning a slider to a predetermined position on a respective disk surface of the plurality of disks.

The actuator as described above is used as the fine actuator and each of the plurality of fine actuators is mounted on an associated flexure tongue of one of the plurality of suspensions through the base, and the slider is potted on the inner disc of the actuator.

In accordance with a further aspect of the present invention, a driving voltage scheme is provided for any two pieces of the piezoelectric elements or any two active parts in one piezoelectric element that enable the two pieces or two parts to expand and contract at the same time, respectively, while the direction of the driving voltages preserves the poling directions of the corresponding pieces or parts throughout the operation so as to prevent depoling of the piezoelectric element. The voltages applied on the electrodes of the two pieces or two parts are two opposing phase AC signals added to a positive DC bias which has the same directions as the poling vector of the pieces or parts, the bias is larger than or at least equal to the amplitude of the AC signal.

Consequently, the driving voltages can precisely control the rotary angle of the free end of the suspension.

One important advantage and a novel aspect of the present invention involves the feature of the annular structure and the method of separating the annular structure into active parts and inactive parts which enable the actuator to have the function of generating rotary motion within the electrode plane. With these advantages and features, the actuator with dimensions similar to the slider can be installed between the suspension, more specifically, flexure tongue and slider to drive the magnetic pole tip of the slider wide and fast to follow a moderate runout.

Another important feature of the present invention is that the actuator can easily be fabricated into a multilayer structure with various dimensions by tape casting, thick film screen printing, sand blasting and techniques of MEMS (microelectro mechanical systems).

Other objects, as well as the structure and features of the present invention to achieve those objects, will be apparent by considering the following detailed description of preferred embodiments, presented in conjunction with the accompanying drawings.

DETAILED DESCRIPTION OF THE PREFERRED EMBODIMENTS

Hereinafter, basic structures and preferred embodiments of the present invention will be described with reference to the drawings. FIG. 1 through FIG. 5 show the basic structures and the corresponding operations of the present invention.

Figure 1:
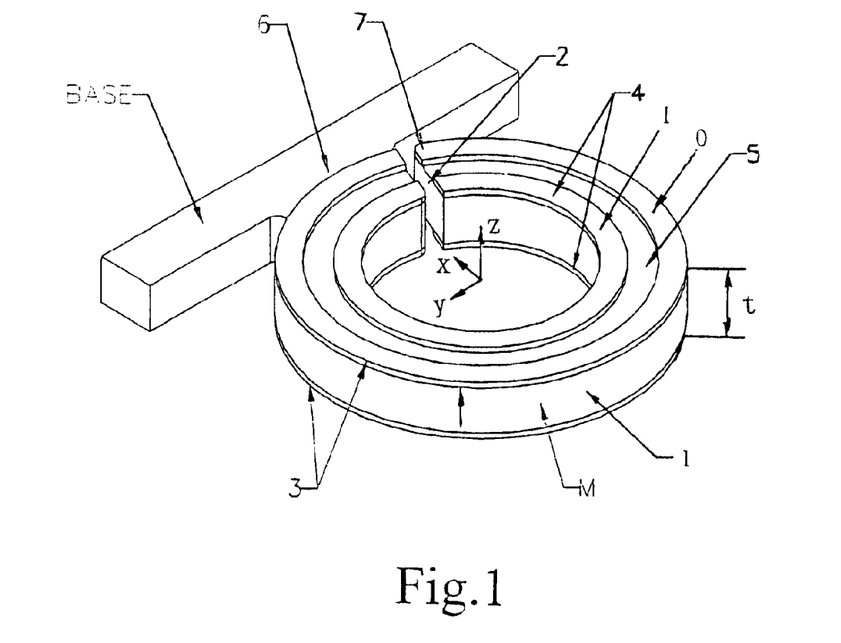
FIG. 1 is a top prospective view of the simplest structure of an annular split-morph.

Referring more particularly to FIG. 1, the simplest structure of the present invention is ilustrated. It is just a single piece of piezoelectric plate with an annular configuration, thickness t and polarized in the direction of its thickness.

In FIG. 1, designated by reference 1 is an annular piezoelectric plate with a gap 2 in a radial direction. On the two opposite surface of the plate are the electrodes with definite patterns. The plate is furthermore divided into two, i.e., inner and outer parts I and O by the electrode patterns. 3 and 4 indicate two pairs of upper and lower electrodes of O and I. Further, 5 indicates an electrode crevice where no electrode is applied on piezoelectric plate 1. Designated by reference numeral 6 is the joint of one end of the annular plate to the base. 7 indicates the other end, i.e., the free end of the annular plate. In this embodiment, the annular plate and the base are an integral body made of the same piezoelectric materials. As described hereinbefore, the two parts I and O can be poled either in the same or opposite direction to form a parallel annular split-morph or an antiparallel annular split-morph. It might also be so arranged that only I or O are poled to form the so-called partial poling split-morph. Shown in FIG. 1 is a parallel split-morph. Arrows shown in all the drawings hereinafter represent polarization directions.

As shown in FIG. 1, the direction from the annular plate center to the middle point of the base edge is designated as the x-axis, the electrode plane as the x-y plane and the height direction as z-axis. The deformation of the free end as it moves under the effect of a driving voltage is then roughly a rotation around its center. Therefore, displacement of the free end along y-axis can be achieved. In this embodiment, the middle part of the annular element, designated by reference M, has also a slight displacement along the x-axis. The rotary angle, so as the displacement/voltage sensitivity, and resonance frequency of the actuators can be accurately controlled by varying the dimensions of its inner and outer radii, thickness t and electrode patterns. It should be noted that all the drawings refereed to in this document are not to scale.

Figure 2:
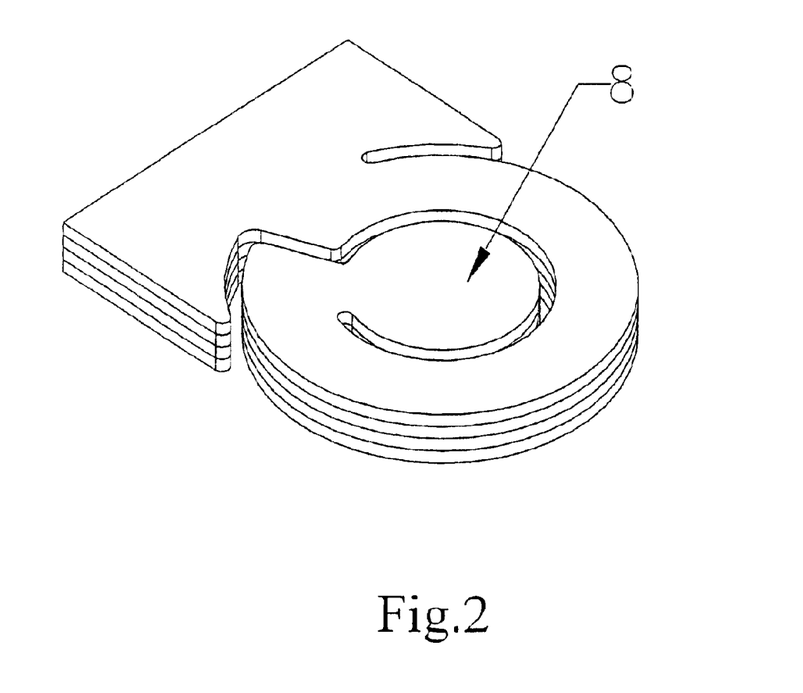
FIG. 2 is a top prospective view of an annular split-morph with an inner disc.

FIG. 2 illustrates a modification of the simplest structure shown in FIG. 1. In FIG. 2, reference numerals the same as those in FIG. 1 designate the same components. The operation of this actuator is similar to the actuator shown in FIG. 1. The only difference is that there is an inner disk 8 connected to the free end of the annular plate and it also constructs an integral body with the annular part. The inner disc can provide a relatively larger area on which the object to be driven, for example, the slider, is potted so that the disc can transmit the rotation of the free end to the object. The inner disc itself also roughly rotates around a center.

To obtain a large stroke and a high resonance frequency are basic requirements of micro actuator design, especially for the secondary stage actuator of a dual stage servo system. It is necessary to increase the rigidity in the height direction while maintaining relatively high displacement/voltage sensitivity of the actuator, i.e., getting a large generative displacement under a relatively lower driving voltage. In order to fulfill this purpose, a multilayer structure of the present invention is proposed and will be described below with reference to the drawings.

There are several different configurations of this multilayer annular split-morph due to differences in the selected manufacturing method. Taking the poling scheme into consideration, there is also the differentiation of parallel, antiparallel and partial poling multilayer actuators. Multilayer structures can be achieved simply by potting two or more single thin plate actuators together or manufactured by various traditional multilayer processes. Typical forms and variations of the present invention will be depicted below with reference to FIG. 3 through FIG. 5.

Figure 3:
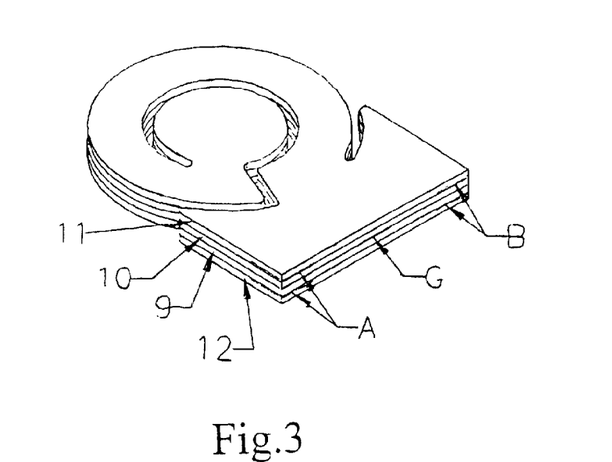
FIG. 3 is a top prospective view of a multilayer annular split-morph with an inner disc.

FIG. 3 shows a typical configuration and its driving voltage scheme of a multilayer structure of the present invention. As shown in FIG. 3 each layer is actually a parallel annular split-morph. Designated by reference numeral 9 through 12 are piezoelectric layers interleaved with internal electrodes. 11 and 12 each are top and bottom piezoelectric cover layers which prevent exposure of the surface electrode. Internal electrode layers are exposed on the side of the actuator to form external electrodes A, B and G. G is a common electrode providing a ground voltage of 0V constantly. The electrodes A and B provide driving voltages to inner part I and outer part O of the annular element respectively. The voltages applied on the electrodes A and B are two opposing phase sine wave signals added to a positive DC bias which has the same directions as the poling vector of the piezoelectric layers. The bias prevents the depoling failure which occurs easily in the multilayer structure. A large stroke could be achieved with the two opposing phase driving signals. When the voltage is applied, the active layers 9 and 10 can generate synchronous rotation as described hereinbefore. Because the thickness of the piezoelectric layer is much thinner than the piezoelectric plate, the multilayer annular split-morph has higher displacement/voltage sensitivity compared to the single plate one. Of course the number of the active layers can be much more than two layers as shown in the drawing.

Figure 4:
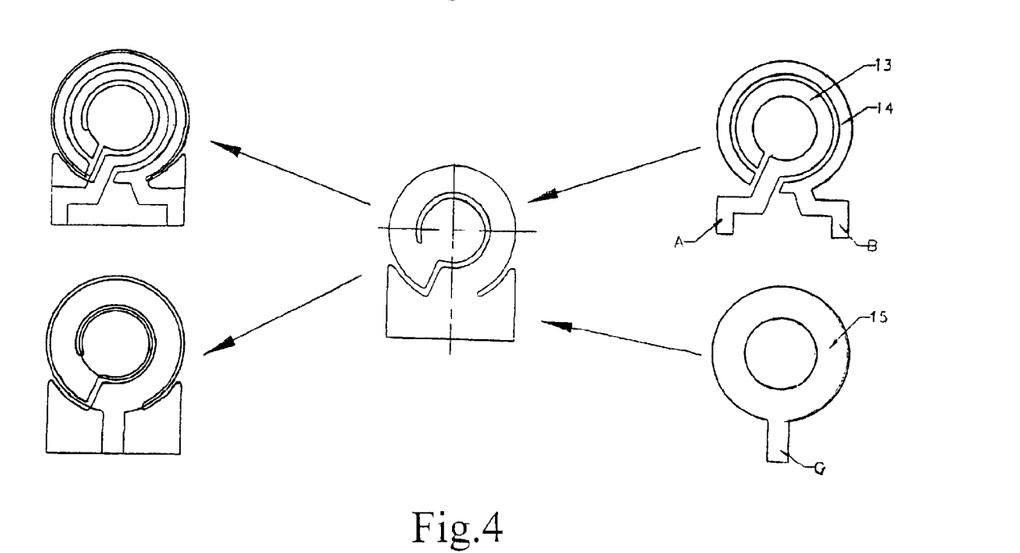
FIG. 4 is a top plan view of the internal electrode patterns and their alignment.

FIG. 4 illustrates the detailed electrode patterns of the annular split-morph. In FIG. 4, designated by numerals 13 and 14 are an inner circle electrode and an outer circle electrode printed on the same layer. 15 is the pattern of the common ground electrode of electrodes 13 and 14 printed on an adjacent piezoelectric layer.

Furthermore, the multilayer parallel annular split morph will become a multilayer partial poling annular split morph if one of the two electrode patterns designated by 13 and 14 is deleted or one of the two parts 13 and 14 is selected to apply a driving voltage. The multilayer antiparallel annular split-morph can be manufactured if the two corresponding parts designated by 13 and 14 in each piezoelectric layer have opposite poling directions. Accordingly, the driving voltage scheme should be modified. The stroke of the partial poling actuator is roughly one half of that of the parallel or antiparallel actuators under the same driving voltage.

Figure 5:
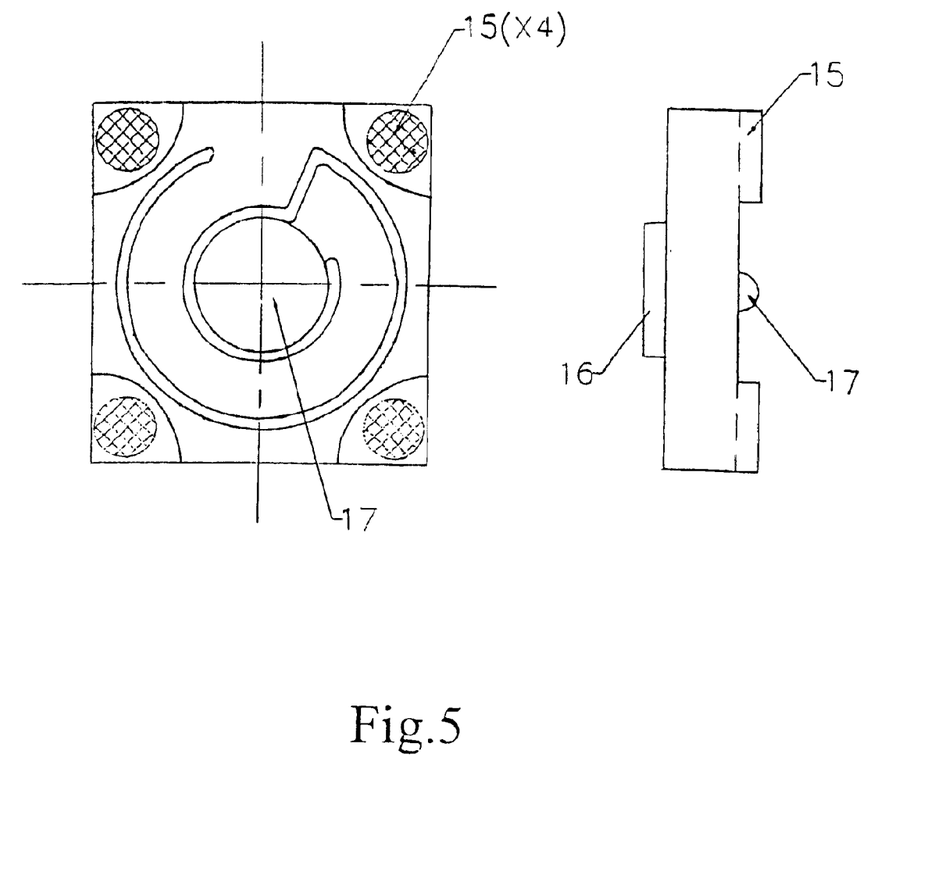
FIG. 5 is a top plan view and side view of an annular split morph with an inner disc and a rectangular surrounding base.

FIG. 5 is another variation of present invention. The base plate of the actuator surrounds the annular piezoelectric element so that there is enough potting area to fix the actuator. Shown in FIG. 5 is an actuator with a rectangular configuration. Another modification is also proposed and will be described bellow with reference to the drawing. Four quarter circles at four corners designated by reference 15 are potting areas which can also be made as a step. The step is slightly higher than the plane of the annular piezoelectric element so as to control the clearance between a moveable part of the actuator and the potting surface. For the same reason, the inner disc is designed to be slightly higher than the annular area as described by reference numeral 16 to control the clearance between the slider and the actuator. Designated by reference numeral 17 is a small bulge which has the same height as the step and can restrain the deformation of the moveable part of the actuator along the direction of its thickness during service. The bulge has little effect on the rotation of the actuator and should be made of a durable material such as diamond-like carbon and so on. The step and the bulge could be made by ion etching, screen printing process and so on.

Figure 6:
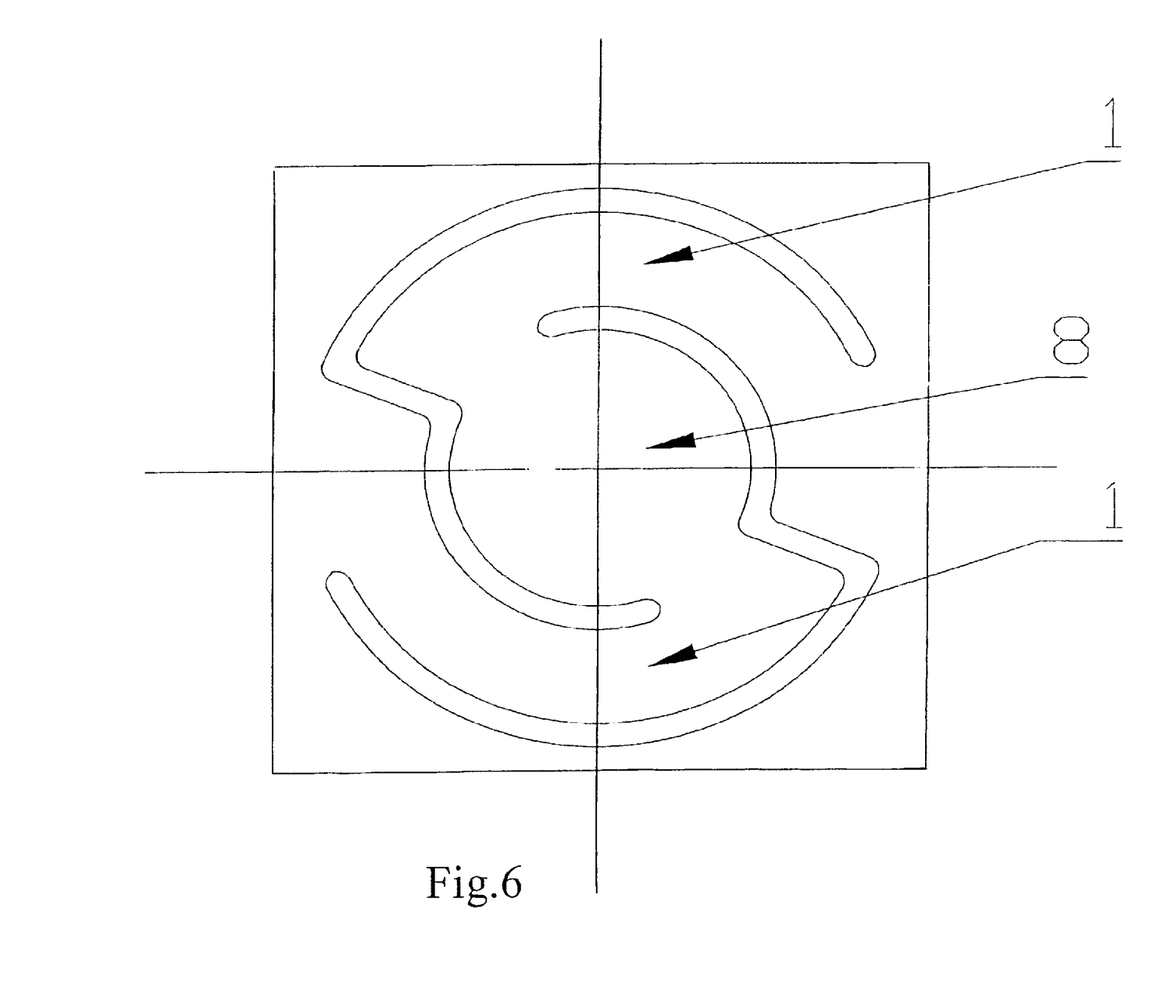
FIG. 6 is a front view of an S-type rotary actuator of the present invention.

Referring to FIG. 2, the annular piezoelectric element shown therein is C shaped. However, the piezoelectric element and the inner disk can also be S shaped so that an S-type rotary actuator is proposed, as shown in FIG. 6. The reference numerals that are the same as those in the previous figures designate the same components. In comparison to the C-type actuator, the S-type actuator is designed to increase the structural stability as well as the resonance performance. Furthermore, the inner disk can get more precise rotation or translation movement. Driving mechanism of the S-type rotary actuator is the same as the C-type rotary actuator.

Figure 7:
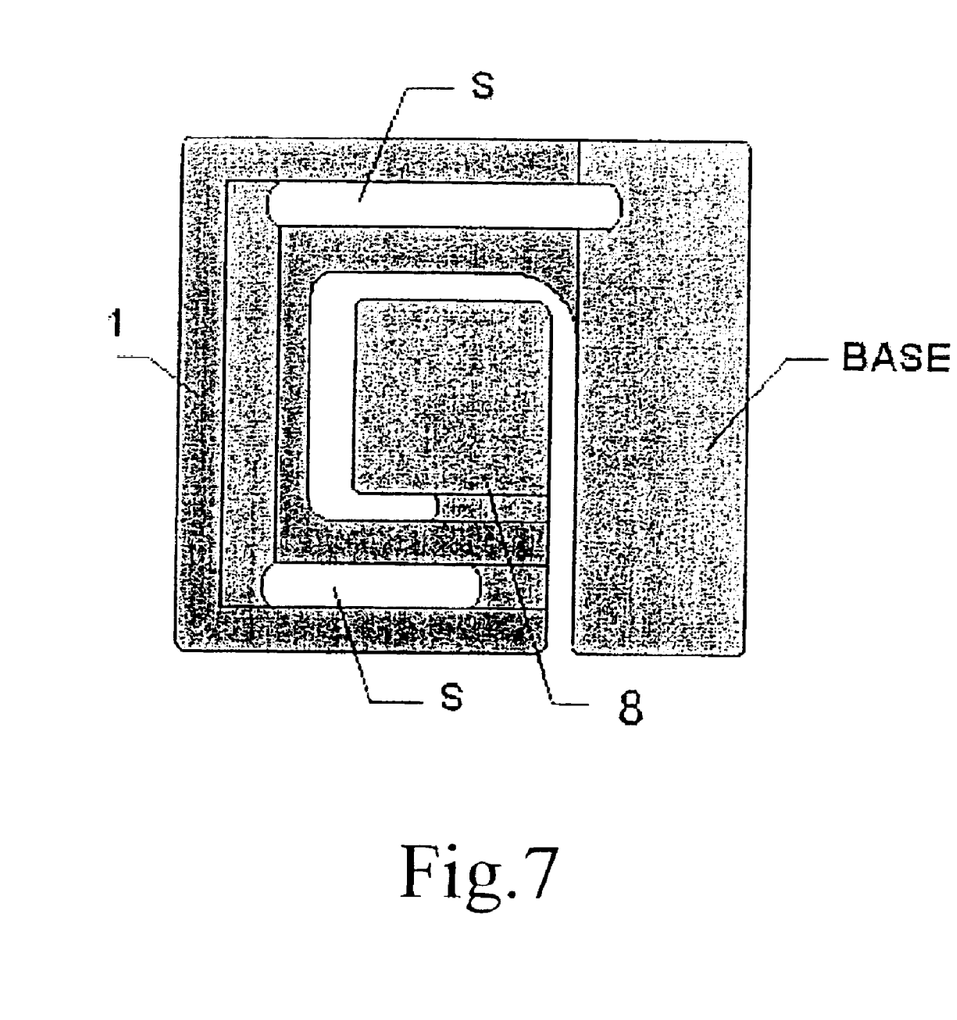
FIG. 7 is a front view of a tri-be am rotary actuator of the present invention.

Actually, the annular piezoelectric element 1 in FIG. 1 can take any form, for example, a square frame comprising three straight beams. FIG. 7 shows a front view of a tri-beam rotary actuator of the present invention, the reference numerals that are the same as those in the previous figures designate the same components. In a straight beam of the tri-beam rotary actuator is provided a slit that can be used to control the alignment of internal electrodes. Since there are three beams in the actuator, their stroke is larger than one beam for the same length. Other advantages of the tri-beam rotary actuator include large potting area, easy separation of electrodes and small dimensions.

Figures 8, 8A:
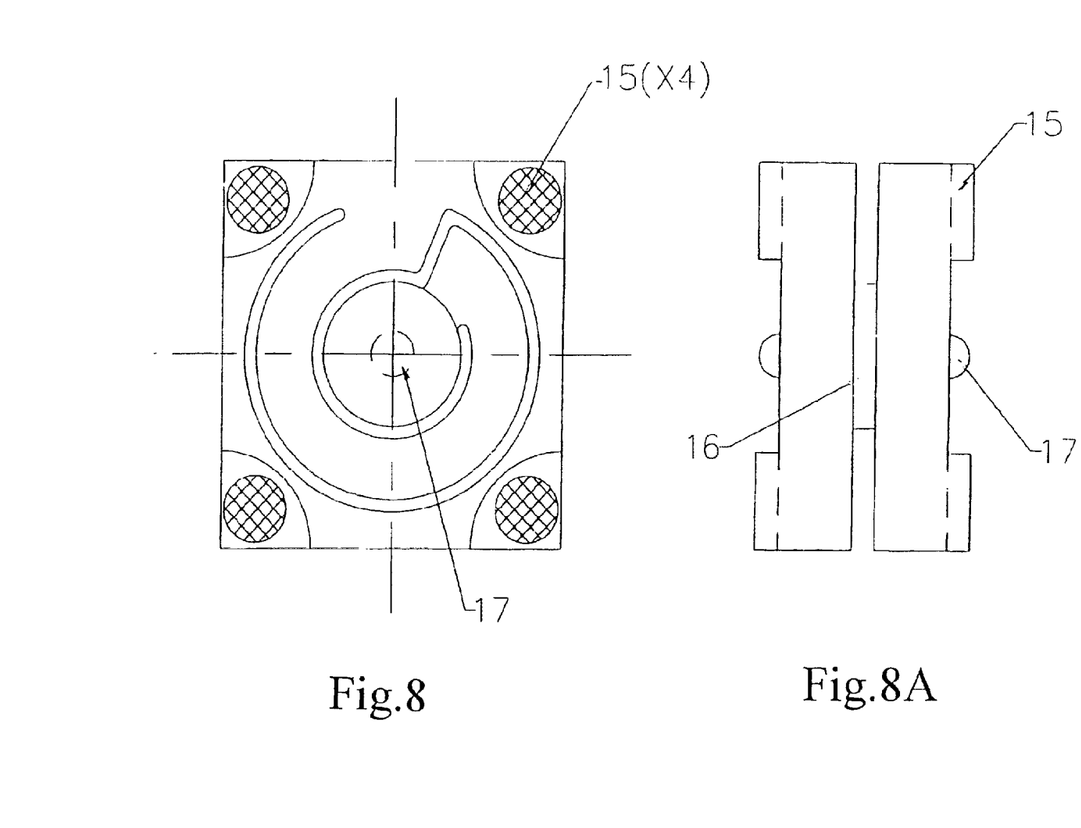
FIGS. 8, 8A and 8B are a top plan view and side views of a piezoelectric actuator stage.

FIG. 8 shows other variations of the present invention. As shown in FIG. 8A, the actuator stage includes two actuators shown in FIG. 5 that are connected to each other through the inner disk step 16. Each actuator generates rotational motion in opposite direction to the connecting portion relatively. Four steps 15 on one surface of the actuator are connected to the slider and four steps 15 on the opposite surface thereof are connected to the flexure tongue. Accordingly, the stroke of the magnetic pole tip formed on the slider is enlarged to almost twice compared to the single actuator.

Figure 8B:
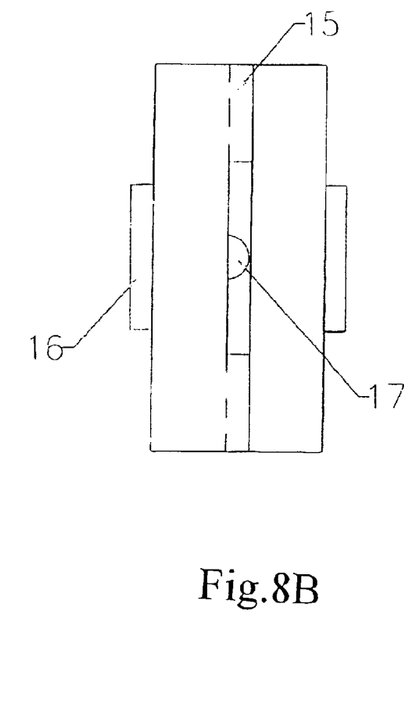

As shown in FIG. 8B, the actuator stage also includes two actuators that are connected to each other through the four steps 15. Each actuator generates rotational motion in opposite direction to the connecting portion relatively. One surface of the inner disk step 16 of one of the two actuators is connected to the slider and the opposite surface of the inner disk step 16 of the other actuator is connected to the flexure tongue. Accordingly, the stroke of the magnetic pole tip formed on the slider is enlarged to almost twice compared to the single actuator.

Although the actuator stages shown in FIG. 8 includes only the two actuators, the number of the stacked actuators is not limited depending on specific situation. Moreover, this method can be applied for other piezoelectric actuators, e.g. the actuators shown in FIGS. 2, 3, 6 and 7.

As described hereinbefore, the actuator could be either a single plate or multilayer one.

Hereinafter, preferred embodiments of the present invention will be described with reference to FIG. 9 through FIG. 13. In these embodiments, the present invention, as the secondary fine actuator, is applied to a dual stage actuator system of hard disk drives. The dual stage actuator system comprises a conventional voice coil motor as a primary actuator for track seeking, coupled with a secondary microactuator for settling and track following.

FIG. 6 illustrates an embodiment of the dual stage actuator system in accordance with the present invention.

Figure 9:
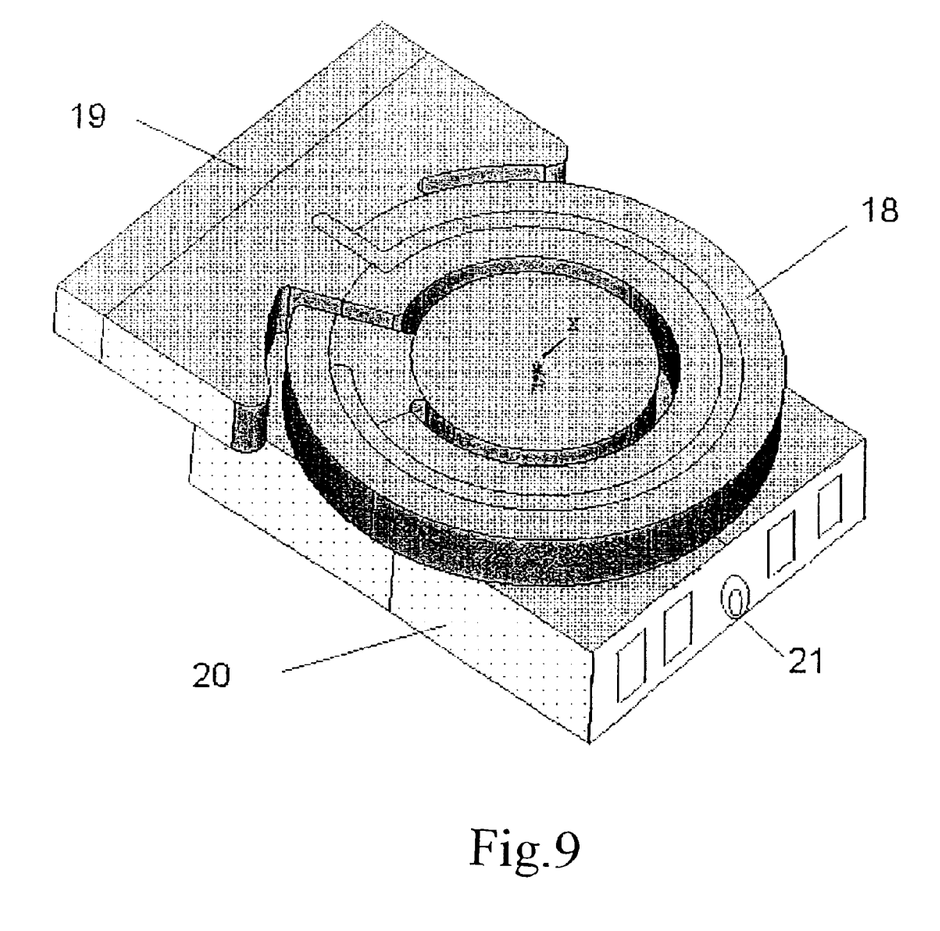
FIG. 9 illustrates a configuration of a typical assembly of an actuator of the present invention and a slider.

One of the specific piezoelectric actuators of the present invention, designated by reference numeral 18, is mounted on a flexure tongue via the base surface designated by numeral 19. The slider designated by reference numeral 20 is potted to the inner disc on the opposite surface of the actuator. As the secondary stage fine actuator, the actuator rotates the slider around the center of the inner disc so that the magnetic pole tip designated by reference 21 moves across the data track in a definite stroke at very high speed for settling and track following.

Figure 10:
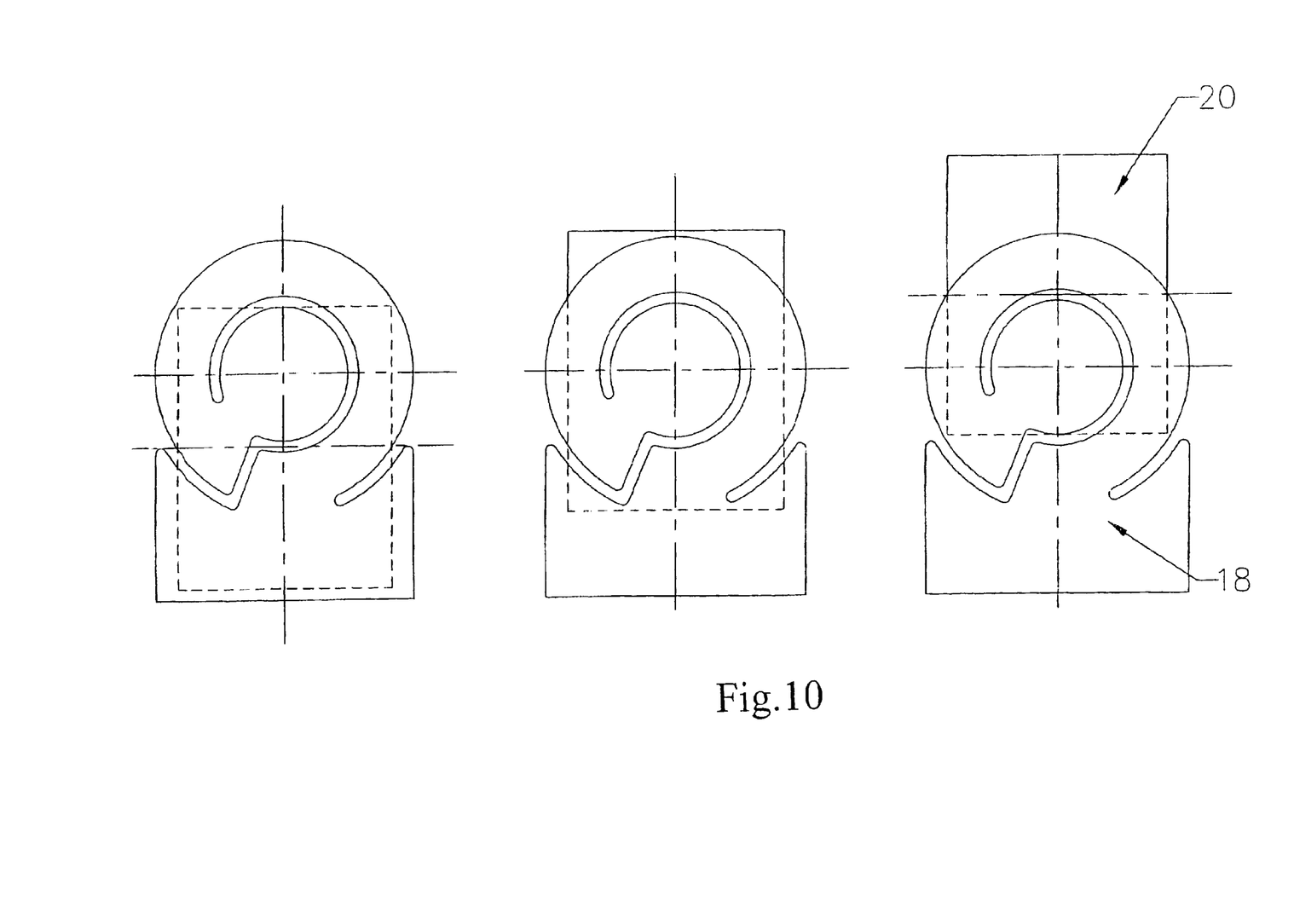
FIG. 10 is a diagram showing relative positions between the rotary actuator and the slider.

FIG. 10 shows relative positions between the rotary actuator and the slider, the reference numerals that are the same as those in FIG. 9 designate the same components.

Figure 11:
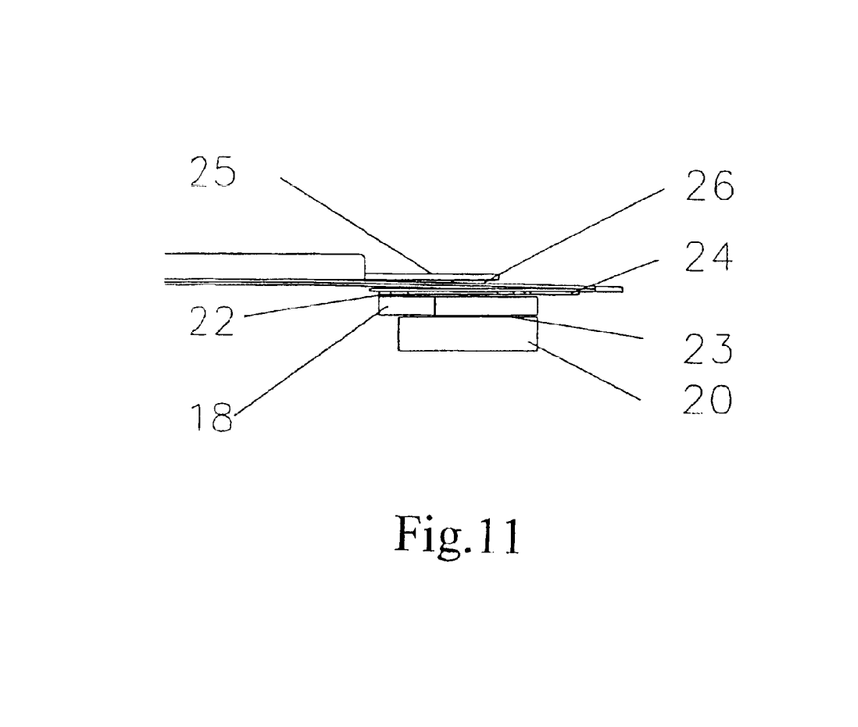
FIG. 11 and FIG. 12 are side views of a suspension assembly with the micro piezoelectric actuator of the present invention.

Shown in FIG. 11 is a detailed configuration of this embodiment, where the actuator is the one described in FIG. 3. In FIG. 11 numerals that are the same as those in FIG. 9 designate the same components. Designated by reference numerals 22 and 23 are thin adhesive layers. 24 through 26 are the flexure tongue, load beam and dimple of the normal suspension, respectively. Advantages of this embodiment are of the relative large stroke and the small size of the actuator and its compatibility to the existing suspension.

Figure 12:
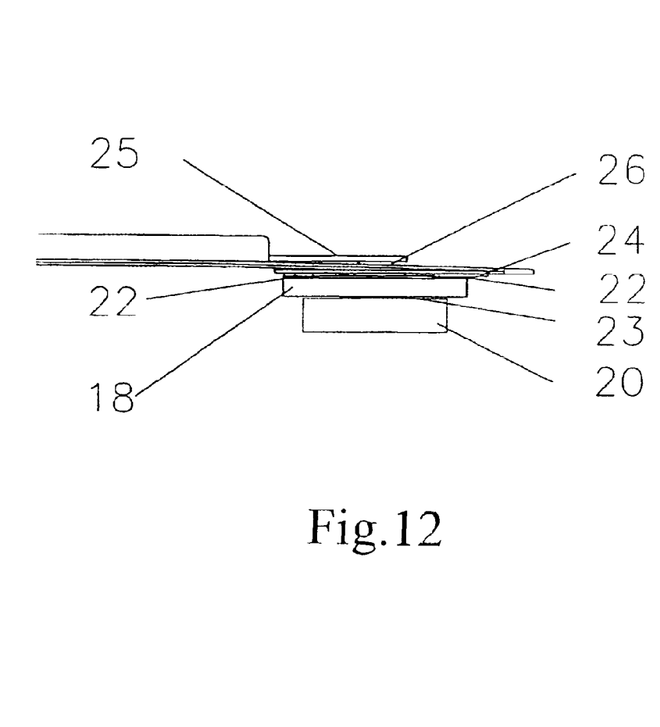

Shown in FIG. 12 is a detailed configuration of another embodiment, where the actuator is the multilayer one described in FIG. 5. In FIG. 12, numerals that are the same as those in FIG. 11 designate the same components. The valuable advantage of this embodiment is the symmetrical feature that is beneficial to dynamic performances of the slider, such as flying height stability, resonance frequency and so on.

Figure 13:
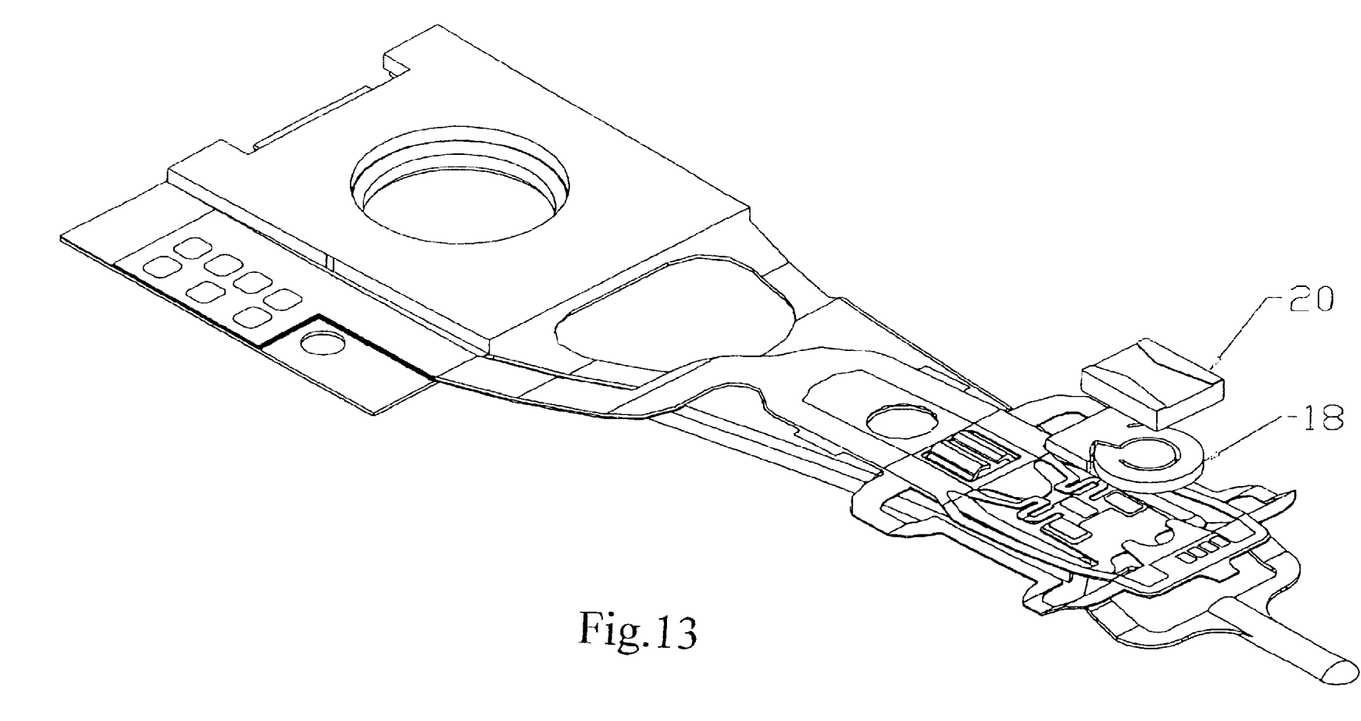
FIG. 13 is an assembly view of an embodiment on HGA.

FIG. 13 illustrates the assembly view of this embodiment, the reference numerals that are the same as those in FIG. 9 designate the same components.

Although the dual stage actuator servo system in this embodiment is illustrated by an example of hard disk drives, it is also applicable to an optical disk system for obtaining the high compact feature.

Properties of a typical actuator of the present invention are given below. The stroke and resonance frequency of the actuators depend on their dimensions. Following are typical dimensions of the multilayer actuator: total thickness from 0.1 mm to 0.2 mm, 0.015 mm for each piezoelectric layer, outer diameter of the annular actuator from 0.8 mm to 1.2 mm, inner diameter thereof from 0.5 mm to 0.9 mm, inner disc diameter from 0.4 mm to 0.6 mm. If a 30% pico slider is driven by the partial poling actuator, the stroke at the pole tip under 15 volts of applied driving voltage is between 1 $\mu$m to 2.5 $\mu$m, while the resonance frequency of the actuator and slider assembly could exceed 15 kHz.

The advantages of the proposed actuator are readily apparent. Compared with the existing secondary micro actuators, it has enough stroke and higher mechanical resonance frequency. These performances make it into an extremely hopeful candidate for the secondary microactuator in a dual stage servo system.

It is evident that the present invention achieves the objects and meets the ends set forth above, as well as those inherent therein. Various modifications may occur to one skilled in the art without departing from the spirit and scope of the invention. Accordingly, the present invention is not limited to the embodiments as described in details herein and as shown in the accompanying drawings.

What is claimed is:

1. A piezoelectric actuator comprising:
    a base made of a piezoelectric materials;
    an annular piezoelectric element including a gap along a radial direction of the annular piezoelectric element, a fixed end of the annular element is connected to the base while the other end is free, said annular element is divided into at least two annular parts along directions of its circumference by the electrode patterns applied on at least one of two opposite surfaces of the annular piezoelectric element and polarization directions of the annular piezoelectric element; said annular piezoelectric element is polarized in a direction of its thickness;
    a voltage driver coupled to said annular piezoelectric element, said voltage driver adapted to apply driving voltages to said annular piezoelectric element such that a first half of said polarized parts is at least one of expanded or contracted, while another half is at least one of expanded, contracted or remains unchanged to generate a rotary motion within a plane of said electrode surface in said annular piezoelectric element to cause said free end to move in the direction perpendicular to said gap.

2. A piezoelectric actuator set forth in claim 1, further comprising: an inner disc coupled to said free end, to provide an area on which an object to be driven is potted.

3. A piezoelectric actuator set forth in claim 2, wherein said annular piezoelectric element is constructed with a multilayer configuration, where the inner electrodes run into said base and are exposed on the side surface of said base to form external electrodes.

4. A piezoelectric actuator set forth in claim 3, wherein said base surrounds said annular piezoelectric element to provide a symmetrical configuration.

5. A piezoelectric actuator set forth in claim 4, wherein at least part of one of the two opposite surfaces of said base is higher than said annular piezoelectric element, while at the opposite surface said inner disc is higher than said annular piezoelectric element so as to control a clearance between moveable parts and stable parts in the actuator, and a bulge is provided at a center of said inner disc surface to restrain deformation of said annular element in its thickness direction.

6. A piezoelectric actuator set forth in claim 1, wherein said base and said annular piezoelectric element are made of a same material and by the same process and technique.

7. A piezoelectric actuator set forth in claim 1, wherein said base is made of a material different from said annular piezoelectric element.

8. A piezoelectric actuator set forth in claim 1, wherein polarization vectors are in the same direction for at least two of said polarized annular parts.

9. A piezoelectric actuator set forth in claim 1, wherein polarization vectors are in the opposite directions for at least two of said polarized annular parts.

10. A piezoelectric actuator set forth in claim 2, wherein said inner disk and said annular piezoelectric element are made of the same materials and by the same process and technique.

11. A piezoelectric actuator set forth in claim 2, wherein said inner disk is made of a different material from said annular piezoelectric element.

12. A piezoelectric actuator set forth in claim 2, wherein said annular piezoelectric element is C shaped.

13. A piezoelectric actuator set forth in claim 2, wherein said annular piezoelectric element and the inner disk are S shaped.

14. A piezoelectric actuator set forth in claim 2, wherein said annular piezoelectric element has a square frame including three straight beams, furthermore, a slit can be formed in the straight beam to control the alignment of internal electrodes.

15. A piezoelectric actuator set forth in claim 1, wherein said actuator is adapted to be connected at least one of the inner disk and the base to at least one other annular piezoelectric actuator to form an actuator stage, a direction of rotational motion for said actuator is opposite that for that at a connecting portion to an adjacent actuator.

16. A piezoelectric actuator set forth in claim 1 further comprising:
    a plurality of disks;
    a plurality of vertically aligned head sliders mounted on distal ends of a plurality of suspensions via micro piezoelectric actuators; and a voice coil motor as a primary stage actuator to simultaneously drive the plurality of suspensions in a long stroke;

wherein said piezoelectric actuator serves as a secondary fine actuator to drive one of said head sliders in a fine stroke to position said slider to a predetermined position with respect to a surface of the said plurality of disks, said piezoelectric actuator is mounted on an associated flexure tongue of one of the said plurality of suspensions through the base, and the slider is potted on said inner disc of said actuator.

17. A piezoelectric actuator set forth in claim 16, wherein each of said plurality of fine actuators is mounted on a base plate of one of the plurality of suspensions through the said base of the actuator to drive a load beam to move the slider across data tracks of the surface of one of said disks.

18. A piezoelectric actuator set forth in claim 16, wherein said slider is potted on said inner disc of said actuator, the center of said slider is at least one of aligned to the center of said disc, front offset and back offset.

19. A method of actuating a piezoelectric actuator including an annular piezoelectric element and a base with radial gap where the annular piezoelectric element includes a fixed end connected to the base and a free end, the base is made of a piezoelectric material, the annular element is divided into at least two annular parts along the direction of its circumference by electrode patterns applied on at least one of two opposite surfaces of the annular piezoelectric element and polarization directions of the annular piezoelectric element, the method comprising:

polarizing said annular piezoelectric element in a direction of its thickness;

applying driving voltages such that a first half of said polarized parts is at least one of expanded or contracted, while another half is at least one of expanded, contracted or remains unchanged;

generating a rotary motion within a plane of said electrode patterns in said annular piezoelectric element to move the free end of said annular piezoelectric element in a direction perpendicular to said radial gap.

* * * * *

UNITED STATES PATENT AND TRADEMARK OFFICE
CERTIFICATE OF CORRECTION

PATENT NO. : 6,653,763 B2
DATED : November 25, 2003
INVENTOR(S) : Kai Wu et al.

It is certified that error appears in the above-identified patent and that said Letters Patent is hereby corrected as shown below:

Column 2,
Line 2, "gimble" should be -- gimbal --

Column 3,
Lines 26, 28 and 30, "prospective" should be -- perspective --
Line 39, "tri-be am" should be -- tri-beam --

Column 4,
Line 31, "refereed" should be -- referred --

Column 5,
Line 46, "bellow" should be -- below --

Signed and Sealed this

Fourteenth Day of December, 2004

JON W. DUDAS
*Director of the United States Patent and Trademark Office*